United States Patent [19]

Jacks et al.

[11] Patent Number: 5,639,011

[45] Date of Patent: Jun. 17, 1997

[54] ATTACHING COMPONENTS AND REWORKING CIRCUIT BOARDS

[76] Inventors: David C. Jacks, 394 Lincoln, Pomona, Calif. 91767; Randall R. Walston, 22533 S. Vermont Ave. #53, Torrance, Calif. 90502

[21] Appl. No.: 390,755

[22] Filed: Feb. 17, 1995

Related U.S. Application Data

[63] Continuation-in-part of Ser. No. 382,890, Feb. 2, 1995, abandoned.

[51] Int. Cl.$^6$ .............. B23K 1/018; B23K 3/04; H01L 21/58
[52] U.S. Cl. .............. 228/180.21; 228/6.2; 228/55; 228/264
[58] Field of Search ............. 228/6.2, 44.7, 228/180.21, 180.22, 264, 20.1, 19, 55

[56] References Cited

U.S. PATENT DOCUMENTS

| | | | |
|---|---|---|---|
| 3,632,973 | 1/1972 | O'Keefe | 228/51 |
| 3,699,306 | 10/1972 | Finch | 228/55 X |
| 4,518,110 | 5/1985 | Breske et al. | 228/51 |
| 4,528,746 | 7/1985 | Yoshimura | 228/264 |
| 4,696,096 | 9/1987 | Green et al. | 228/20.1 X |
| 4,799,617 | 1/1989 | Friedman | 228/180.21 X |
| 4,967,950 | 11/1990 | Legg et al. | 228/180.22 |
| 5,048,742 | 9/1991 | Fortune | 228/51 |

FOREIGN PATENT DOCUMENTS 144874  6/1993  Japan ............. 228/180.22

*Primary Examiner*—Kenneth J. Ramsey
*Attorney, Agent, or Firm*—Fish & Richardson P.C.

[57] ABSTRACT

In one aspect, a device for attaching a component to a circuit board is provided, comprising a circuit board held in a holder and a contact heater that heats the component on the circuit board by contact and by conducting heat through the component. In a further aspect, the contact heater is in a wand which is manually moved onto the component. In another aspect, the invention provides a method for attaching a component to a circuit board, comprising the steps of gripping the component with a contact heater; placing the component on the circuit board; and heating the component on the circuit board by contact, wherein heat conducted through the component melts solder under the component and attaches the component to the circuit board.

13 Claims, 12 Drawing Sheets

(BACKGROUND)

(BACKGROUND)

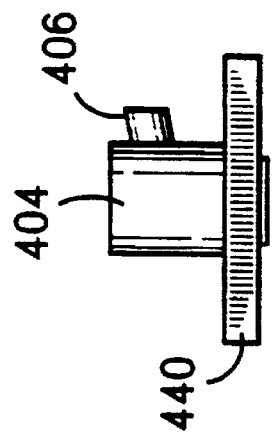
FIG. 12
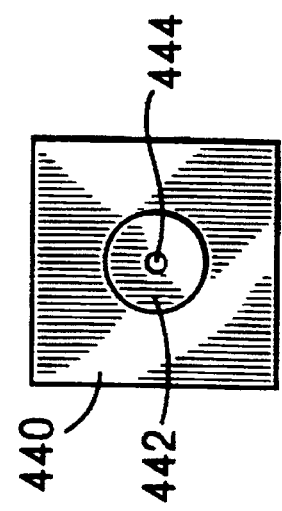
FIG. 13A  FIG. 13B
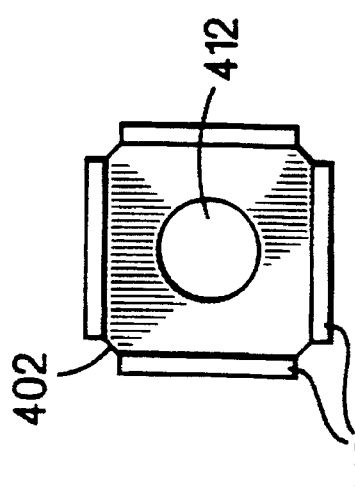
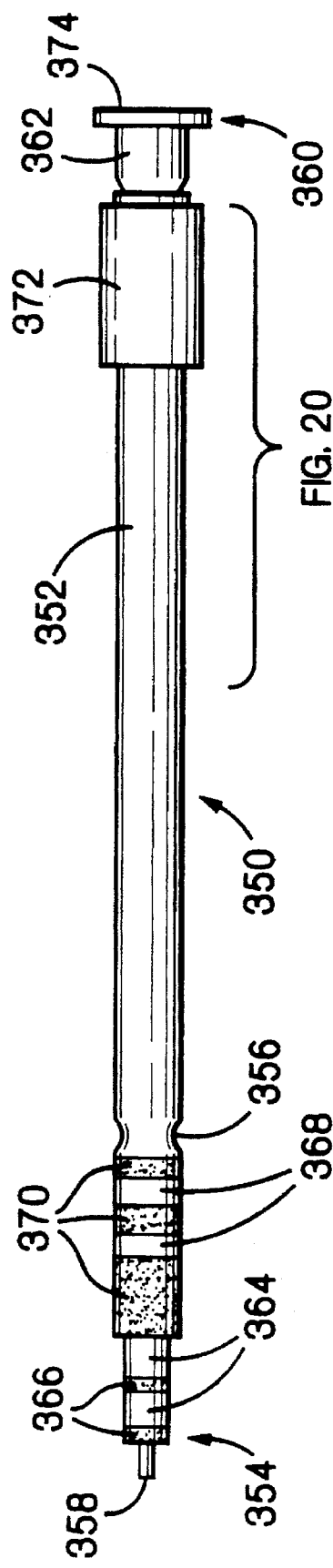
FIG. 14

ATTACHING COMPONENTS AND REWORKING CIRCUIT BOARDS

CROSS-REFERENCE TO RELATED APPLICATION

This application is a continuation-in-part of application Ser. No. 08/382,890, filed Feb. 2, 1995, entitled "De-soldering and Reworking Circuit Boards", now abandoned.

BACKGROUND OF THE INVENTION

This invention generally relates to reworking circuit boards. The invention relates more specifically to de-soldering or removing components from, and attaching or soldering components to, circuit boards, including integrated circuit components packaged as surface mount devices.

Circuit boards of electronic equipment contain numerous integrated circuits and other electronic components soldered to the board. When components fail, electronics manufacturers need to remove and replace the components; components are also removed for recycling when boards become obsolete. However, the dense packing of circuit boards, and the small size of component pins, makes de-soldering of defective components and attaching or re-soldering new components difficult.

FIG. 1 shows a portion of a circuit board 10 (in section) on which an integrated circuit (IC) component 12 is mounted. The IC 12 is a surface mount technology (SMT) component of the ball grid array (BGA) type. BGA type ICs have ball-shaped electrical contacts 14 attached to the underside 16 of the IC. As shown in FIG. 2, the contacts 14 are arranged in a rectangular array comprising numerous rows and columns of contacts. The contacts provide an electrical connection between the IC and the circuit board. As shown in FIG. 1, a contact can be soldered to a plated-through hole 18 connected to a copper foil trace 20, providing an electrical path from the IC to the bottom of the circuit board. Usually the soldering is done by a wave soldering machine.

Once a BGA IC is soldered to a circuit board, the contacts 14 are inaccessible for later de-soldering or reworking. Re-soldering the component appears impracticable without wave soldering the entire board. Thus, many circuit board manufacturers do not attempt to de-solder, rework or re-solder BGA ICs; if a BGA IC fails, the whole board is discarded.

FIG. 3 shows a portion of a circuit board 10 (in section) on which an integrated circuit 22 is mounted. IC 22 is a standard SMT device or component having pins 24 protruding from the body 26 of the IC. Pins 24 are soldered to the top of circuit board 10 and do not extend into holes in the board. FIG. 3 is a simplified drawing; actual SMT devices may have 20 or more pins per side.

Once an SMT device is soldered to a board, de-soldering it or removing and re-soldering it is difficult because the pins are small (about 1 mm wide) and closely centered (0.040" centering is common). Applying sufficient heat to the pins, without damaging the IC itself with excessive heat, is difficult. For example, hot air (at approximately 650 degrees F.) can be directed at the pins, but the hot air inevitably flows over the component, posing a high risk of damaging or "cooking" the component or reflowing solder on adjacent components. In addition, hot air flow is not controllable so as to be useful for soldering. Alternatively, when heat is directly applied to the pins (also called leads) using a conventional soldering iron or equivalent, or through hot air, the component and circuit board act as a heat sink, absorbing much of the applied heat. As a result, the component quickly reaches a high temperature, de-soldering takes too long, and the component can be damaged before the solder melts.

SUMMARY OF THE INVENTION

The invention provides devices and methods for reworking circuit boards, and for attaching and re-soldering components to circuit boards.

Generally, one aspect the invention provides a device for removing a component soldered to a circuit board held in a holder, having an air heater that provides a flow of warmed air to the circuit board on the side opposite the component, and a contact heater that heats the component on the circuit board by contact.

One feature of the invention is that the contact heater has a housing, a slidably removable heating element in the housing, and a vacuum bore in the heating element. Another feature of the invention is that the contact heater has a flat heating plate for heat transfer by direct contact. Other features include: the heating plate has a vacuum nozzle coupled to the vacuum bore; the contact heater has a variable temperature control circuit responsive to a change in temperature of the contact heater when the contact heater touches the component; a fume removal device is integral to the contact heater; the contact heater is rotatably mounted on an arm above the board, whereby the contact heater is rotatable about a Z axis perpendicular to a top surface of the component; the contact heater is movable longitudinally in an axis generally parallel to the board.

Still other features include: the air heater has a second heating element in a housing, and an air blower in the housing for directing airflow across the heating element to a vent in the housing; the vent has a perforated cone with a base of the cone attached to the housing; the air heater is in a housing having at least one top wall sloping downwardly away from the board; the air heater is mounted in a closed housing, and further also has a soldering iron or hot air pencil coupled to the housing. Another feature of the invention is a handle with electric power contacts that can interchangeably accept a soldering iron or a hot air pencil.

In another aspect, the invention provides, in a rework device for a soldered component on a circuit board held in a circuit board holder, a conductive heater which can be moved in fixed X and Y axes to directly contact the component to melt the solder.

In another aspect, the invention provides a method for de-soldering a component on a circuit board, having the steps of applying a flow of warmed air to the circuit board on the side opposite the component; heating the component on the circuit board by contact; concurrently with the second step; applying vacuum suction to a top surface of the component; and removing the component from the board using the vacuum suction.

Features of this aspect of the invention include the further substep of waiting until the temperature of the board is near the temperature of the warmed air; providing the warmed air at a mean temperature of no greater than 150 degrees centigrade; limiting the air heat application to a region of the board immediately adjacent to electrical connections between the board and the component; applying cool air to the bottom side of the board after the component is removed; concurrently removing solder fumes from a region around the component and the board.

In another aspect, the invention facilitates attaching a component to a circuit board. In one aspect, a device for attaching a component to a circuit board is provided, comprising a circuit board held in a holder and a contact heater that heats the component on the circuit board by contact and by conducting heat through the component. In a further embodiment, the contact heater is in a wand which is manually moved onto the component.

In one embodiment of the invention, a air heater provides a flow of warmed air to the circuit board on the side opposite the component.

One feature of the invention is that the contact heater has a housing, a slidably removable heating element in the housing, and a vacuum bore in the heating element. Another feature of the invention is that the contact heater has a flat heating plate for heat transfer by direct contact and conduction. Other features include: the heating plate has a vacuum nozzle coupled to the vacuum bore; the contact heater has a variable temperature control circuit responsive to a change in temperature of the contact heater when the contact heater touches the component; a fume removal device is integral to the contact heater; the contact heater is rotatably mounted on an arm above the board, whereby the contact heater is rotatable about a Z axis perpendicular to a top surface of the component; the contact heater is movable longitudinally in an axis generally parallel to the board; the dimensions of the contact heater match dimension of a pin array of the component.

Still other features include: the air heater has a second heating element in a housing, and an air blower in the housing for directing airflow across the heating element to a vent in the housing; the vent has a perforated cone with a base of the cone attached to the housing; the air heater is in a housing having at least one top wall sloping downwardly away from the board.

The present invention also encompasses a method for attaching a component to a circuit board, comprising the steps of:

a) gripping the component with a contact heater;
b) placing the component on the circuit board; and
c) heating the component on the circuit board by contact, wherein heat conducted through the component melts solder under the component and attaches the component to the circuit board, without applying heat through hot air.

The term "placing the component on the circuit board" means any method of placing the component to be attached to the circuit board on the board, including manually.

Among the advantages of the invention are the following. The invention permits rapid removal of components at a temperature lower than that used to solder the component originally. The invention permits rapid removal of SMT components from circuit boards, without damaging the device or bending its pins. The invention enables removal of BGA components without collapsing their solder balls. The invention can remove closely spaced devices on densely populated circuit boards, such as SIMMs. The invention applies heat only to the component to be removed, preventing the solder of adjacent components from melting inadvertently. The invention provides automatic lifting of components at the instant the solder melts by providing upward force integrated in the contact heater. Fume extraction is integrated into the invention so that a separate fume extractor is not needed, saving work space and expense. The invention can compensate for deformed circuit boards and skewed components, and the contact heater can be precisely rotated and positioned in three dimensions. The invention permits rapid removal and replacement of the contact heater, and provides convenient accessories such as a hot air pencil. The invention permits the rapid attachment of components to a circuit board. The invention can be used to attach and replace closely spaced devices on a densely populated circuit board. The invention isolates application of heat to the component being soldered, without heating adjacent components or reflowing solder in adjacent areas of the board. Heat is directed to the component pins rapidly. The circuit board does not absorb or sink as much heat.

The heat is applied in a controlled manner. A flow of hot air is not used for applying heat to the component or its leads, because a flow of hot air is uncontrollable and inevitably flows to adjacent components. This can re-flow solder holding the adjacent components in place, which is undesirable. Thus, one advantage of this method is applying heat only to the component and a region of the circuit board below the component. Adjacent components remain unaffected.

Other advantages and features will become apparent from the following description and from the claims.

BRIEF DESCRIPTION OF THE DRAWINGS

FIG. 12 is a top plan view of a heating flange.

FIG. 13A is a top plan view of a heating plate.

FIG. 13B is a side elevation of a heating plate.

FIG. 14 is an elevation of a contact heater.

DETAILED DESCRIPTION

Figure 1:
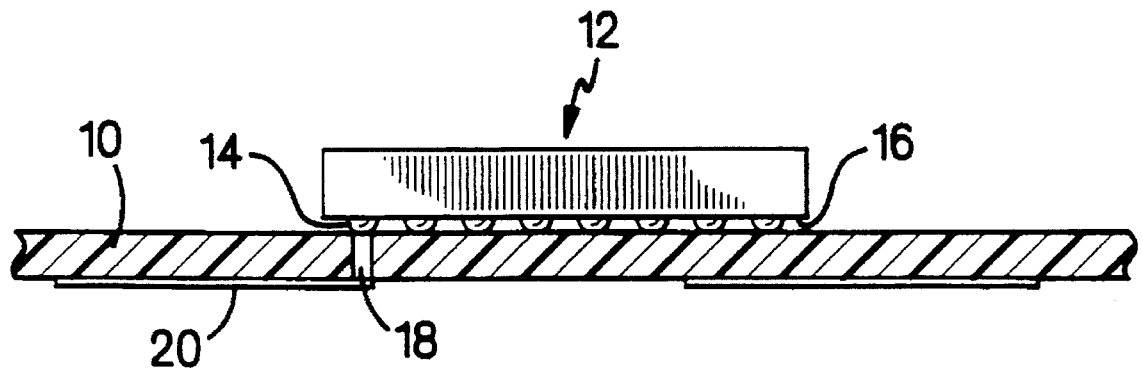
FIG. 1 is a section view of a ball grid array integrated circuit attached to a circuit board.
Figure 2:
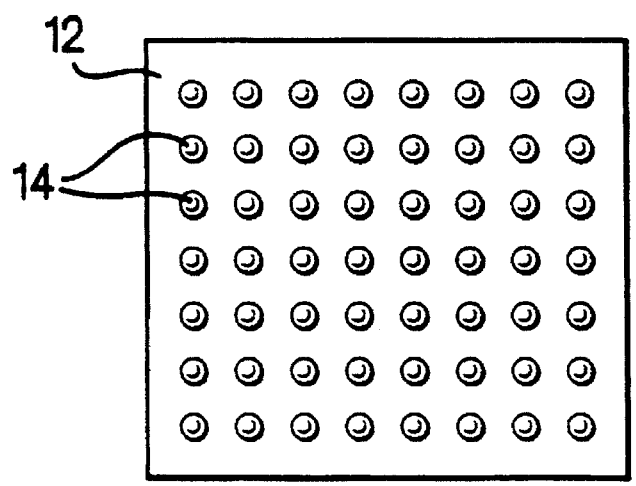
FIG. 2 is a plan view of the underside of a ball grid array integrated circuit.
Figure 3:
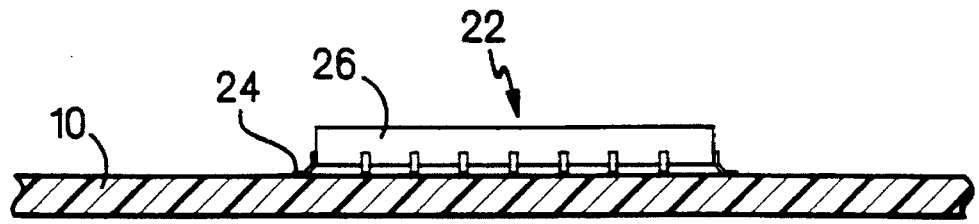
FIG. 3 is a side elevation view of a surface mount technology component attached to a circuit board.
Figure 4:
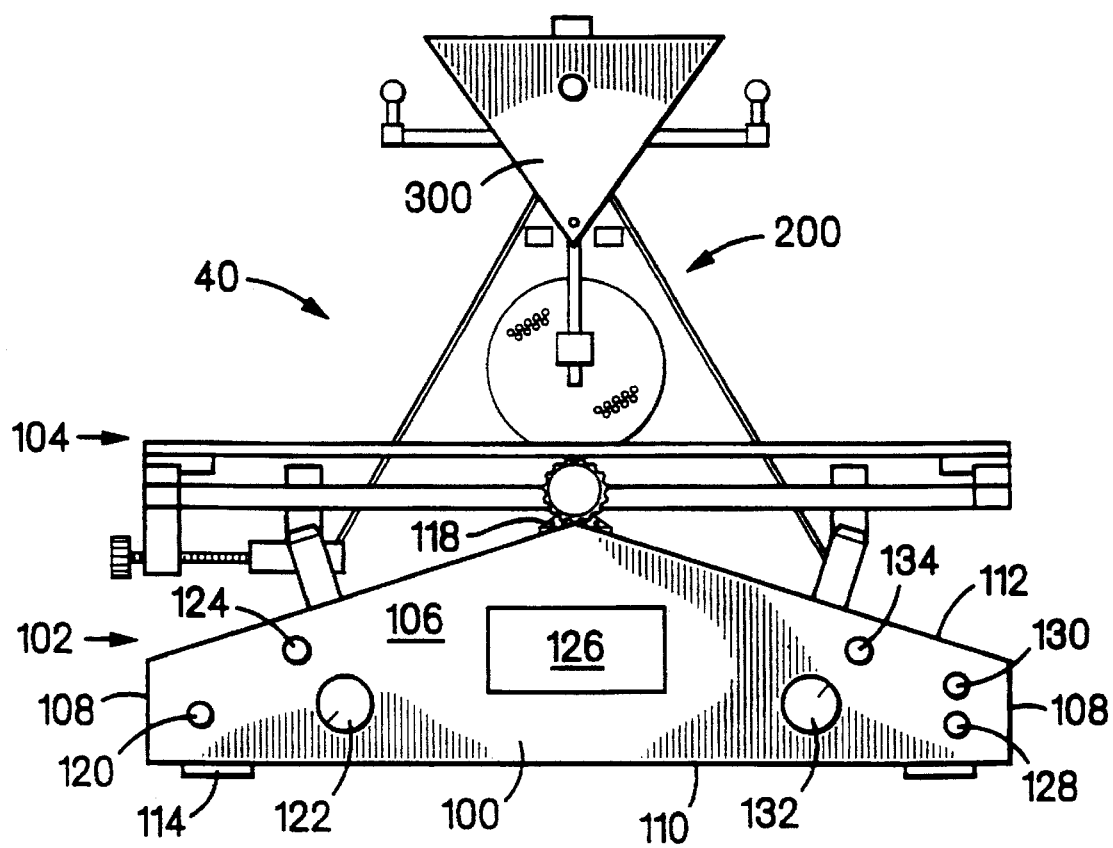
FIG. 4 is a front elevation view of a rework station.

Turning to FIG. 4, a rework station 40 comprises two major subassemblies: a base 100 and a top heater/fume extractor 200. In operation, base 100 and heater/extractor 200 are placed near one another so that the vacuum head 300 of the heater/extractor is over the base.

Figure 5:
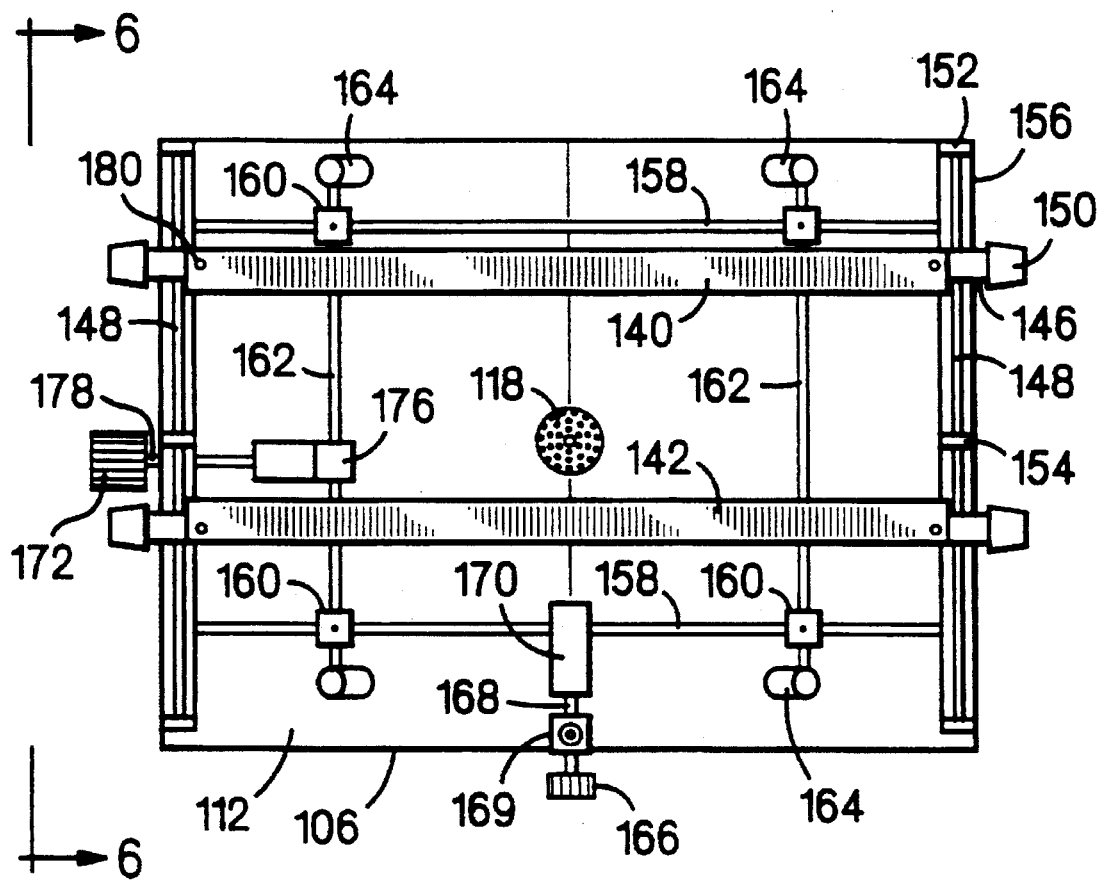
FIG. 5 is a top plan view of a circuit board fixture and rework station base.
Figure 6:
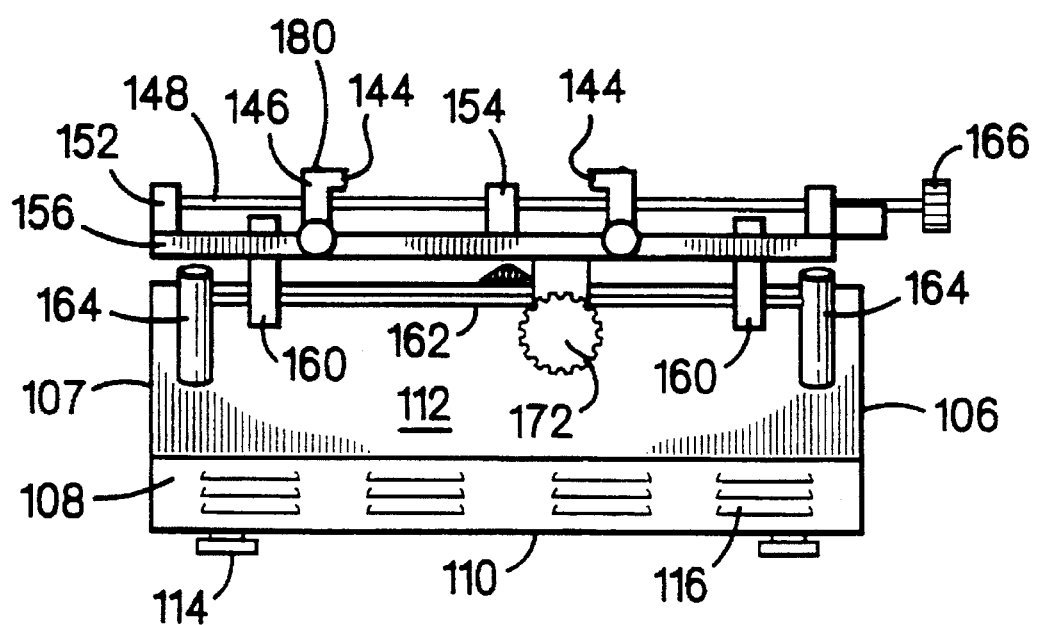
FIG. 6 is a side elevation view of a circuit board fixture and rework station base.

As shown in FIG. 4, 5, and 6, base 100 comprises two subassemblies: a housing or cabinet 102 and a circuit board fixture or holder 104.

Cabinet 102 is a closed box formed by a front wall 106, a rear wall 107, two short side walls 108, a rectangular floor 110, and a downwardly angled top wall 112. Cabinet 102 is supported on at least three vertically adjustable feet 114. The walls are made of sheet metal or an equivalent rigid, heatproof material. Air vents 116 can be provided in the walls. The angled form of the cabinet is an arbitrary, non-functional design feature.

Figure 10:
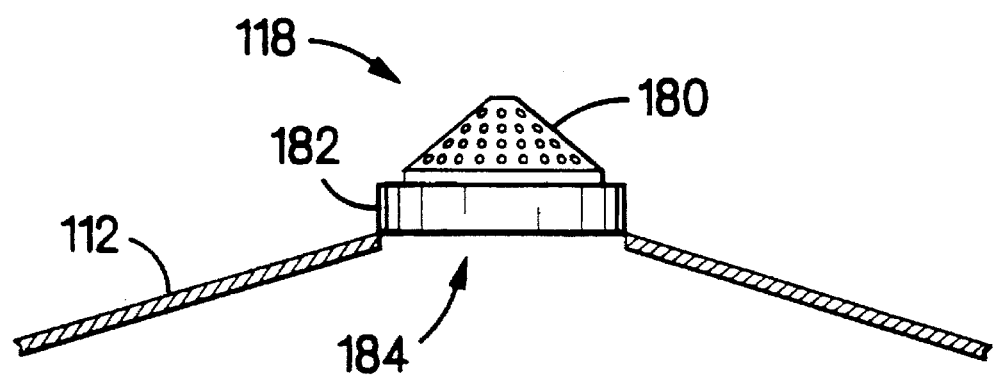
FIG. 10 is a front elevation view, in part section, of an air vent.

Top wall 112 has a conical heat vent 118 protruding from the top center. As shown in FIG. 10, heat vent 118 comprises a perforated, truncated cone or nozzle 180, seated on a circular collar 182 affixed over a hole 184 in top wall 112. As described below, base 100 produces a flow of warm air through heat vent 118 to warm a circuit board.

Front wall 106 has several controls and connectors. Circuit board rework equipment is sometimes used to work on integrated circuits which are highly sensitive to discharges of static electricity. Front wall 106 has a ground strap coupling 120 to which a user can connect a wrist strap for connecting the body of the user to earth ground, so that the apparatus safely routes electrostatic discharges (ESDs) to ground. A combination potentiometer/switch 122 controls power to the base 100 and enables a user to control the temperature of a heating element (discussed below), which provides constant air flow at variable temperature. A pilot lamp 124 glows when power is applied to the base. A digital display 126 shows the temperature of the warm air flow. A user can connect a hot air pencil or soldering iron (discussed below) to base 100 using an air connector 128 and an electrical connector 130. A second potentiometer/switch 132 controls power to the hot air pencil or soldering iron; when power is applied, a second pilot lamp 134 glows.

Figure 16:
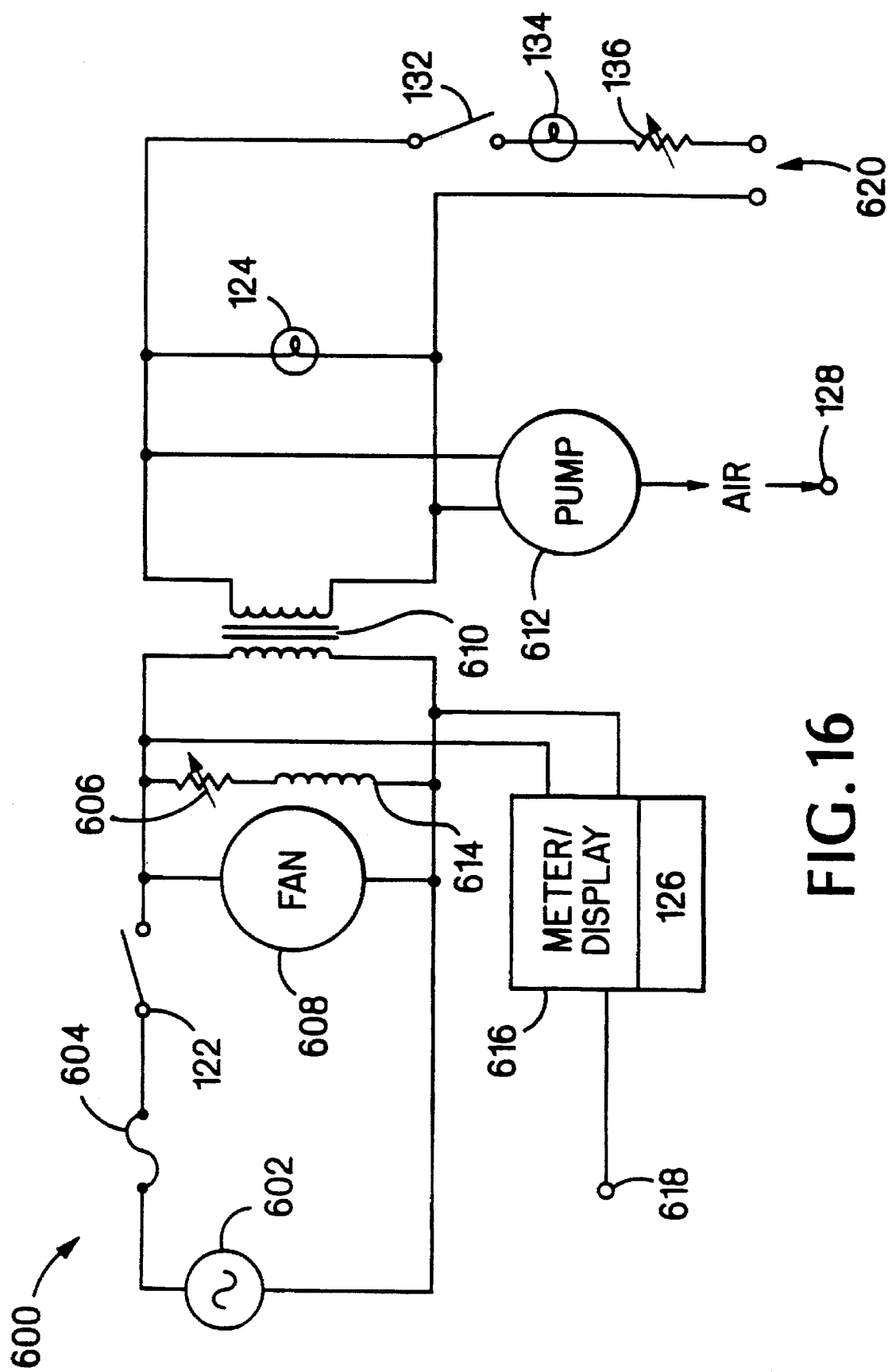
FIG. 16 is a schematic diagram of a rework station base.

Base 100 contains the electrical circuitry and mechanical components shown in FIG. 16. Circuit 600 receives line voltage alternating current at 602. The current is fed to a series-coupled fuse 604 which protects the circuit; a combination potentiometer/switch 122 is connected in series with the fuse and is mounted in the front wall as shown in FIG. 4. The switch portion of the combination potentiometer/switch 122 controls main power. A fan or blower 608 is connected across the line voltage. The fan 608 is mounted in the base 100 adjacent to a heating element 614 and the heat vent 118. A potentiometer 606 of the potentiometer/switch 122 is connected in series with the heating element, enabling adjustment of the heating element temperature. The fan provides a flow of air across the heating element and warmed air exits through the vent. Thus, the fan and heating element together form an air heater that provides a flow of warm air to the circuit board on the side opposite the component. By turning down the potentiometer, the warmed air flow quickly becomes a cool air flow.

A step-down transformer 610 is coupled to the line voltage and reduces the line voltage to 24 volts; a conventional rectifier/filter circuit (not shown) supplies 24 VDC to an air pump 612. This pump produces pressurized air that is fed to connector 128 in front wall 106. As has been mentioned, a hot air pencil can be attached to this connector, enabling a user to direct hot air to a desired part of a circuit board.

Line voltage is also coupled to a conventional meter/display module 616. The module, which is an off-the-shelf unit such as part MTUSCE8-S of Hsiang-Cheng Electric Corp. (Taiwan), is coupled to a sensor 618 (such as a thermocouple) mounted on vent 118 and displays the sensed temperature on a digital display.

Circuit 600 also provides low voltage at terminals 620 which are fed to front panel connector 130. As described, a user can connect a hot air pencil or soldering iron to connector 130 and the voltage at the connector is coupled through the connector to a heating element in the hot air pencil or soldering iron. The low voltage is coupled to a power switch 132 for turning on the hot air pencil or soldering iron. The pilot lamp 134 is coupled in series with the switch. A variable resistor 136, which can be part of a potentiometer/switch 132, permits varying the temperature of the pencil or iron.

Figure 17:
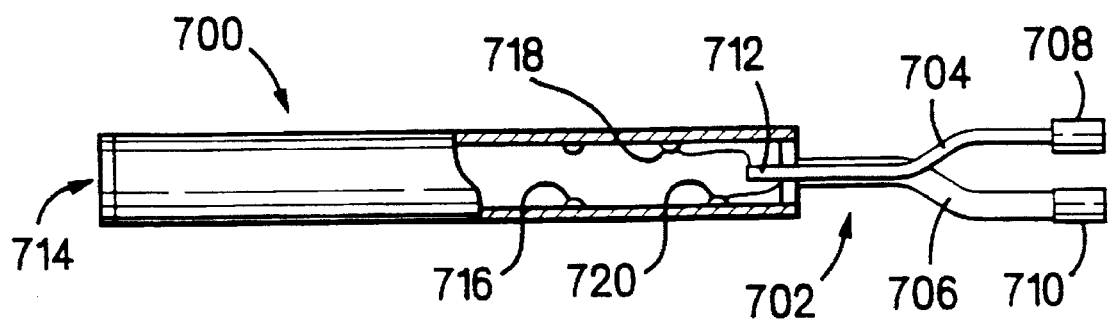
FIG. 17 is a side view, in part section, of an accessory handle.
Figure 18:
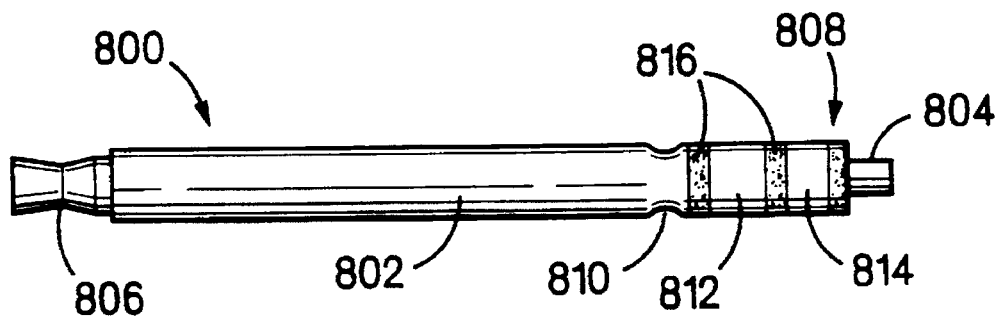
FIG. 18 is a side view of a hot air pencil.

A handle for a hot air pencil, soldering iron, or other accessory, and a removable hot air pencil, are shown in FIG. 17 and 18. As shown in FIG. 17, handle 700 is affixed to a cable assembly 702 having an air hose 704 and an electrical cable 706. The air hose terminates in an air coupling 708 which mates with connector 128 on the front of base 100. Electrical cable 706 terminates in an electrical coupling 710 which mates with connector 130.

Removable hot air pencil 800 has a tubular barrel 802 enclosing a heating element 614 (not shown in FIG. 17) and an air bore 804. The outside diameter of the barrel 802 is slightly less than the inside diameter of handle 700 so that the barrel snugly fits inside the handle. Air bore 804 enters barrel 802; air exits an air nozzle 806. When barrel 802 is inserted into handle 700, by placing the rear end 808 of barrel 802 though a front opening 714 of the handle, the air bore 804 rests tightly over a sleeve 712 within the handle, enabling air to pass through the barrel to nozzle.

Barrel 802 has a circumferential groove or detent 810 near its end 808. When barrel 802 is inserted into handle 700, detent 810 engages a pair of inwardly protruding bosses 716 in the handle, locking the barrel in place, but permitting the barrel to be removed. This enables a user to quickly connect, disconnect, or replace the hot air pencil.

At end 808, barrel 802 has a sandwich of insulating rings and electrical contacts. Contacts 812, 814 route electricity from cable 706 to the heating element within the barrel. The contacts are insulated from the barrel and from one another by insulating rings 816. When barrel 802 is inserted into the handle 700, contacts 812, 814 engage matching wipers 718, 720 within the handle, completing an electrical circuit between transformer 610 and heating element 614.

As shown in FIG. 4, 5, and 6, board fixture or holder 104 can hold a circuit board suspended above the heat vent 118. Generally, the holder comprises two opposing, adjustable circuit board gripping bars 140, 142 resting on a frame that can be moved along an X axis (side to side) or a Y axis (rearward or forward) relative to the front wall 110 of the base. Each gripping bar 140, 142 has an inwardly facing jaw 144 that can accept the edge of a circuit board. Each end of each gripping bar is joined to a guide block 146 which rides on a rail 148. The rail 148 is held rigid by posts 152, 154 which are affixed to end bars 156. Each end of the gripping bars also has an adjustment knob 150 affixed to a screw (not shown) extending through the guide block; one end of the screw terminates adjacent to the rail. Thus, by tightening the screw using the adjustment knob, the corresponding gripping bar is locked in place on the rail; and loosening the screw allows the gripping bar to slide on the rail. This arrangement permits the entire circuit board to be moved in the Y direction.

End bars 156 are affixed perpendicularly to two lateral bars 158, thereby forming a rigid rectangular frame. Lateral bars 158 ride in holes (not shown) in four floating posts 160. Posts 160 are said to be "floating" because they are suspended above top wall 112 by the intersection of lateral bars 158 and two perpendicular frame bars 162. Frame bars 162 run across top wall 112 and are secured to it by four frame posts 164.

Fine Y axis adjustment is done by turning a knob 166, which is coupled to one of the lateral bars 158 through a threaded shaft 168 turning in a tapped box 170. Box 170 is affixed to bar 158. The shaft rotates freely in and is retained in a stationary block 169. Rotating the knob causes the threads on the shaft to pull the entire rectangular frame frontwards or backwards in the Y direction.

X axis adjustment can be done in two ways. Gross X axis adjustment is done by moving the gripping bars apart and sliding the circuit board along the jaws 144. Fine X axis adjustment is done by turning another knob 172, which rotates a threaded shaft 174 in a tapped hole 178. The end of the shaft is retained in a stationary block 176 affixed to frame bar 162. Thus, turning the knob causes threads on the shaft to move end bar 156 (and the entire frame) in the X direction.

The fixture 104 also incorporates means for adjusting the gripping bars 140 to compensate for lack of co-planarity between a circuit board and the heater/extractor. Each end of the gripping bars 140 is joined to a guide block 146 by a set screw 180 rotating concentrically in a spring (not shown) under compression between the guide block and the end of the gripping bar. Thus, turning the set screw 180 causes the spring to compress or expand, permitting a user to selectively twist or flex board held in the gripping bars. Such adjustment is important to ensure that the contact heater is flush against a component, so that no vacuum leaks occur and to promote efficient heat transfer.

Figure 7:
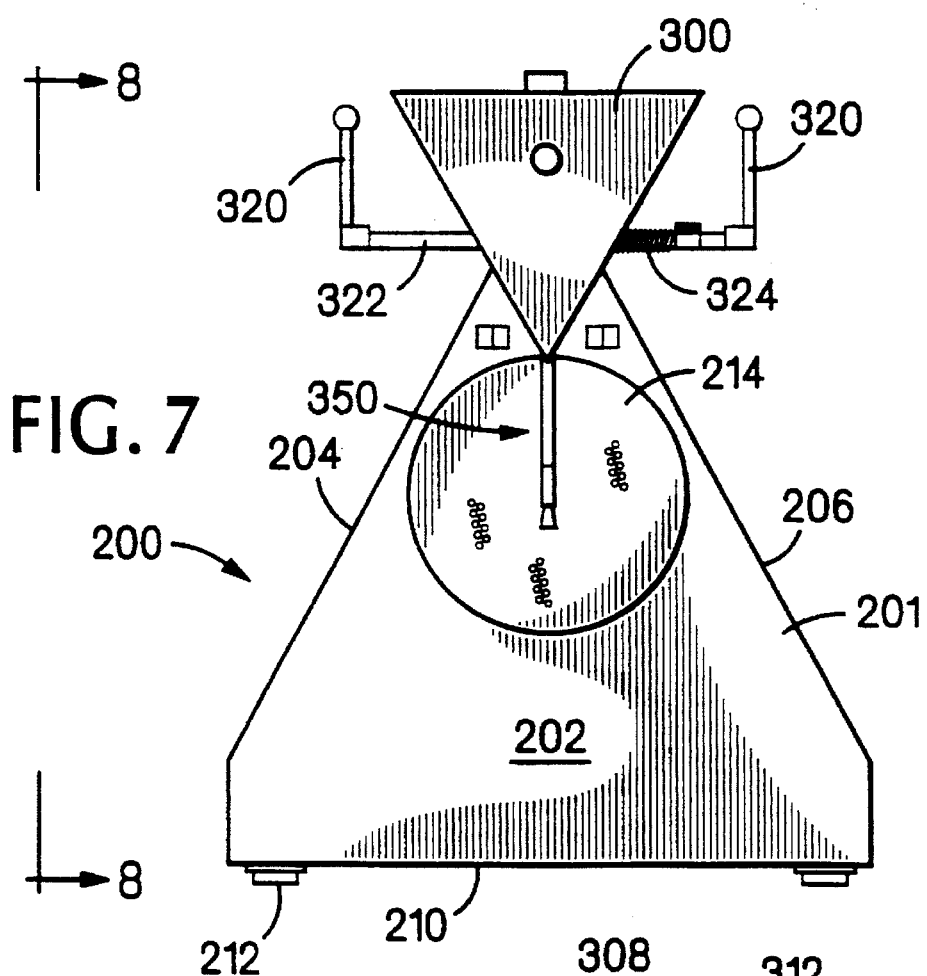
FIG. 7 is a front elevation view of a fume extractor/contact heater for a rework station.
Figure 9:
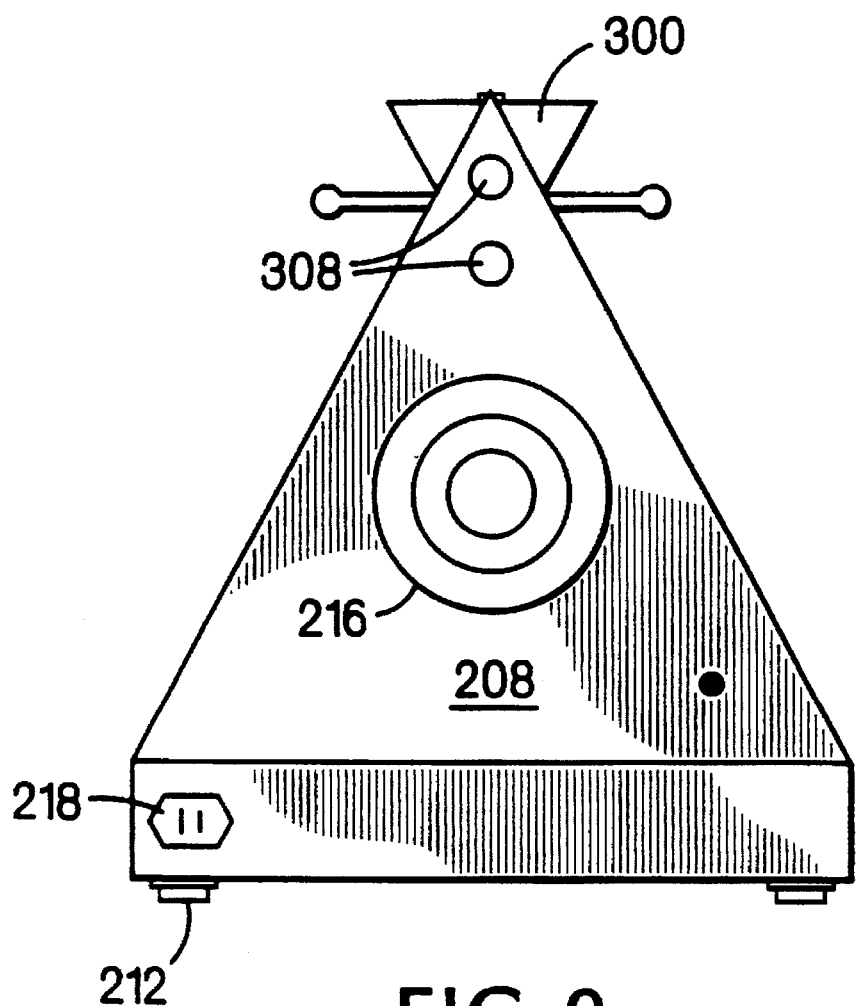
FIG. 9 is a rear elevation view of a fume extractor/contact heater for a rework station.

As shown in FIG. 7, heater/fume extractor 200 has a pyramid-shaped cabinet 201 comprising a front wall 202, left and right walls 204, 206, a rear wall 208, and a floor 210. The pyramid form of the cabinet is an arbitrary, non-functional design feature; other cabinet styles are within the scope of the claims below. Cabinet 201 rests on adjustable feet 212. The rear wall also has a receptacle 218 (FIG. 9) for connecting a power cord to the heater/fume extractor.

A fume extractor filter cover 214 is set into the front wall 202. A fume extraction fan (not shown) is mounted within cabinet 201, and behind filter cover 214; it sucks in vapors and fumes released by soldering or reworking, and exhausts fumes through an exhaust hole 216 in rear wall 208. Filter cover 214 is spring-loaded and magnetically latched to front wall 202, so that gentle forward pressure on the filter cover will break the magnetic attraction between the latch and the wall, causing the filter cover to pop forward slightly. A removable, replaceable fume filter (not shown) is seated in the filter cover. The filter is an activated carbon type. When the filter is replaced, gentle rearward pressure causes the filter and cover to retract within the front wall, and the magnetic latch then holds the cover closed.

Because the fume extraction fan is housed in the same cabinet as the contact heater, this apparatus provides integral fume extraction in a de-soldering/rework station.

A tri-junction box 300 is cantilevered to cabinet 201. Box 300 is supported by two rods 304, 306 which are affixed to box 300 and which extend through the cabinet, terminating in knobs 309. Rods 304, 306 can slide through the cabinet, enabling the box 300 to move in the Y direction relative to a circuit board in the holder 104. This enables a user to position the box (along a fixed Y axis path) directly over a particular circuit on a circuit board, and also permits a user to access the board easily for preparatory work or inspection.

A telescoping tube 308 conceals and carries electrical connections between the cabinet 201 and tri-junction box 300. The tube also conveys vacuum pressure or airflow between the contact heater and vacuum pump.

Figure 8:
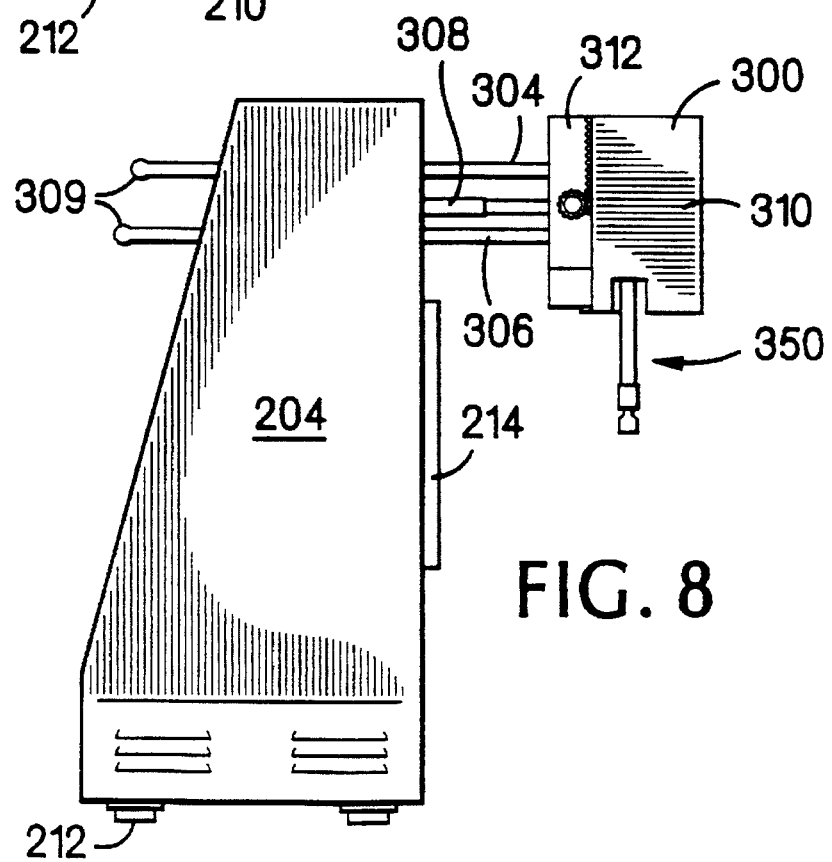
FIG. 8 is a side elevation view of a fume extractor/contact heater for a rework station.
Figure 11:
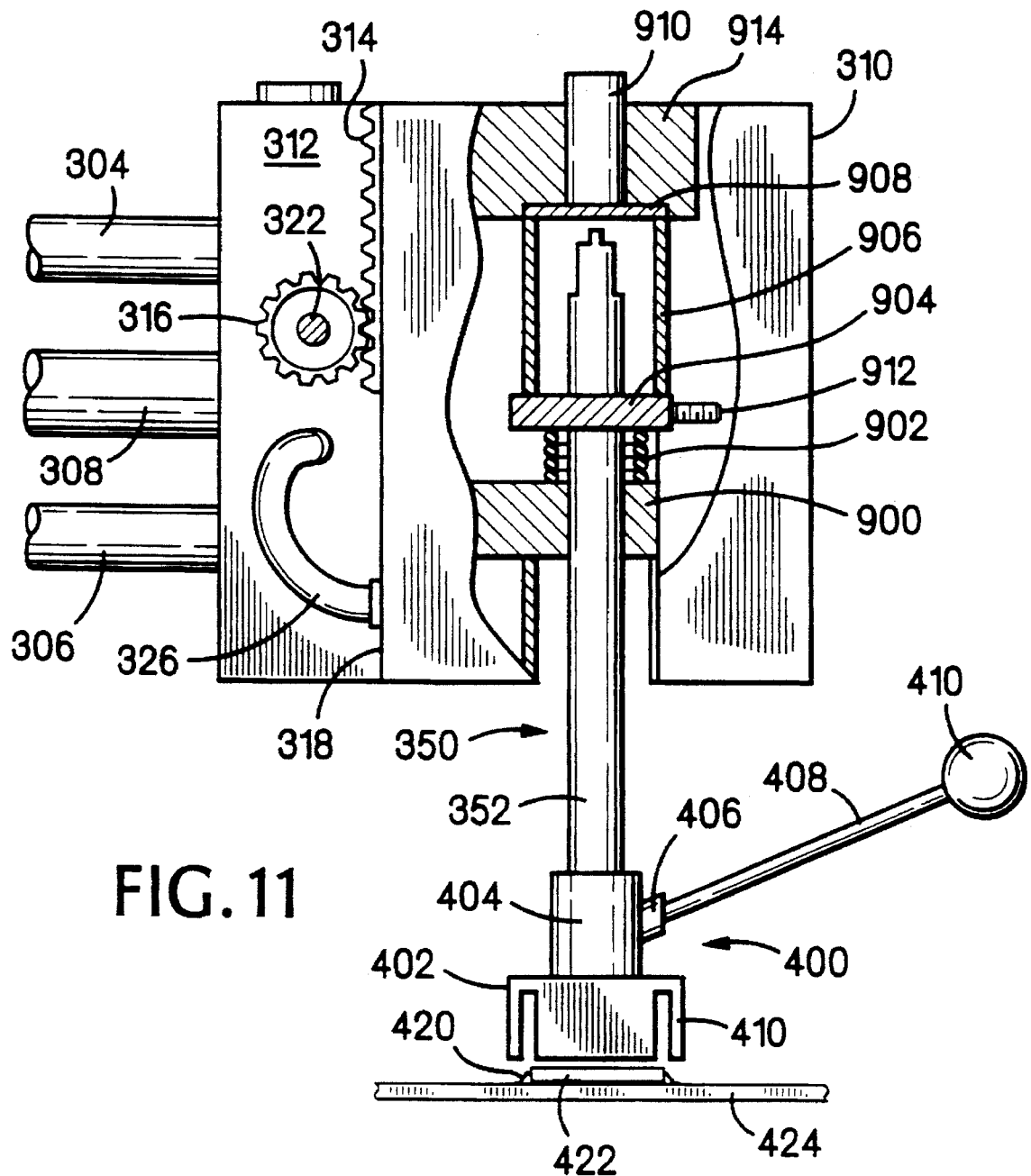
FIG. 11 is a side elevation view of a portion of a fume extractor/contact heater for a rework station, with a junction box shown in part section.

As shown in FIG. 7, 8 and 11, tri-junction box 300 comprises a front box 310 which is vertically movable relative to a rear box 312. A toothed rack 314 is affixed to the rear wall 318 of the front box 310. A gear 316 engages and rides on the rack; handles 320 affixed to a shaft 322 cause the gear to rotate (for clarity, the handles are omitted from FIG. 8 and 11). Gear 316 is retained in the rack by pressure exerted by a spring 324 on the shaft (see FIG. 7). This resistance keeps front box 310 in a desired position above the circuit board and keeps gravity from dropping the front box down. In this way, tri-junction box 300 is precisely adjustable in a fixed path on the vertical or Z axis.

A vacuum hose 326 carries vacuum from rear box 312 to front box 310.

Tri-junction box 300 further comprises a contact heater 350 that heats a component on a circuit board by direct conduction on contact, and without using warmed air directed down on or across the component or its pins. As shown in FIG. 11 and 14, contact heater 350 has a body tube 352 having a circumferential groove or detent 356 near its upper end 354. Contact heater 350 is held in the tri-junction box by a sprung ball which engages the groove 356. Thus, contact heater 350 is slidably removable and replaceable in just a few seconds.

The contact heater has a vacuum bore 358 extending from its upper end 354 to its lower end 360 and terminating in a flexible cup 362. Cup 362 has a lip 374 for sealing the cup to a heating flange. Vacuum bore 358 is coupled through hose 326 and the tube 308 to a vacuum source in the cabinet.

Figure 20:
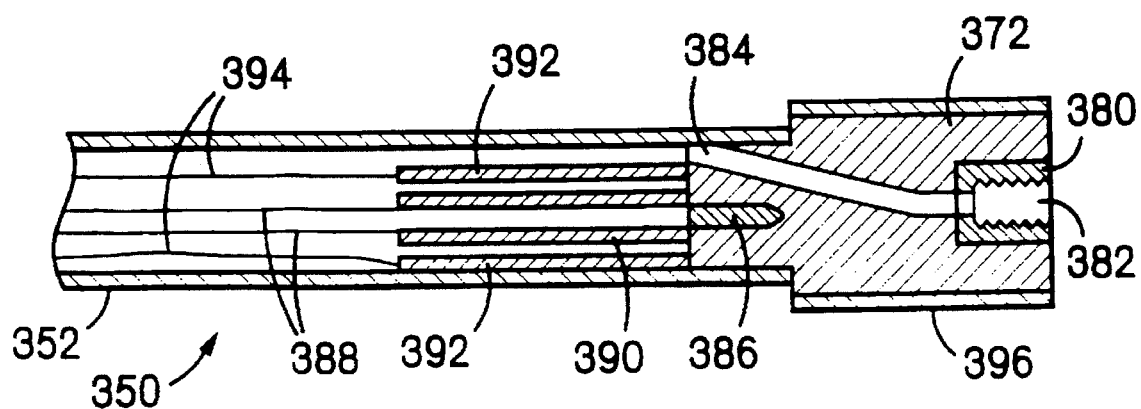
FIG. 20 is a section view of a contact heater.

Contact heater 350 contains a conventional heating element and a thermistor (shown in FIG. 20). The heating element and thermistor each receive electric current via two leads which are coupled to circumferential contacts on the contact heater. As shown in FIG. 14, upper end 354 of body tube 352 comprises a sandwich of insulating rings and contacts. Upper contacts 364 electrically connect tri-junction box 300 to the thermistor within contact heater 350. Upper contacts 364 are insulated from body tube 352 using two insulating rings 366. Lower contacts 368 route current to the heating element within contact heater 350, and are insulated from the body tube by three insulating rings 370. When the contact heater is inserted into the tri-junction box, the contacts engage matching wipers within the box, completing an electrical circuit between a current source and the heating element and the thermistor.

Contact heater 350 also has a collar 372 surrounding its lower end. FIG. 20 shows the lower end of the contact heater in section. (In FIG. 14 and 20, the right side of the drawings is the lower end of the contact heater when it is mounted in the heater/extractor.) Collar 372, which is solid copper, for example, has a metal insert 380 with internal threads 382 for receiving cup 362. A vacuum hole 384 extends from the insert through the collar to the interior of body tube 352, establishing an air path. The thermistor 386 is mounted in the collar and has two electrical leads 388 extending through a rear tube 390 of the collar. A cylindrical heating element 392 surrounds the rear tube. Wires 394 route electricity from contacts 368 (FIG. 14) to the heating element. Wires 394 and the leads 388 are insulated using, for example, fiberglass sleeving and ceramic tubes. Body tube 352 is stainless steel, for example, and a stainless steel wrapper 396 surrounds collar 372 to protect it.

Collar 372 accepts a heat flange holder 400 as shown in FIG. 11. Holder 400 comprises a heating flange 402 affixed to a sleeve 404. Sleeve 404 has a threaded collar 406 which receives a threaded shaft 408 affixed to a handle 410. Flange holder 400 is secured to collar 372 by slipping sleeve 404 over collar 372 and turning shaft 408. Shaft 408 screws into sleeve 404 and tightens it against collar 372. In this manner, the flange holder can be quickly attached or detached from collar 372. Also, the flange holder is rotatable about the Z axis relative to the circuit board (the Z axis is approximately normal to a top surface of a component on the board). Flange holder 400 can be attached at any angular rotation relative to the circuit board, and then tightened, permitting a user to move flange holder 400 precisely in alignment with skewed or angled components on the circuit board.

Also, in this arrangement, lip 374 rests tightly against a hole 412 in heating flange 402. Thus, heating flange 402 can operate simultaneously as a vacuum nozzle and as a heater.

As shown in the section portion of FIG. 11, when contact heater 350 is inserted into tri-junction box 300, upper end 354 of the body tube 352 extends upward through a guide block 900, a spring 902, a collar 904, and a tube 906 having one closed end 908. Collar 904 has a sprung ball (not shown) held in place by a set screw 912; the ball engages detent 356 to hold tube 352 in place. A pushbutton 910 rests against closed end 908 of tube 906, and is guided in a block 914. Downward pressure on pushbutton 910 compresses spring 902. Under sufficient downward pressure, spring 902 is fully compressed and heating flange 402 contacts the component on the board; vacuum pressure retains flange 402 on the component against the tension of the spring 902. Thus, flange 402 is held against the component by vacuum, but is upwardly biased by spring 902. In this manner, at the instant that the solder holding the component melts, spring tension pulls flange 402 and tube 352 rapidly upward, removing the component from the board.

Figure 15:
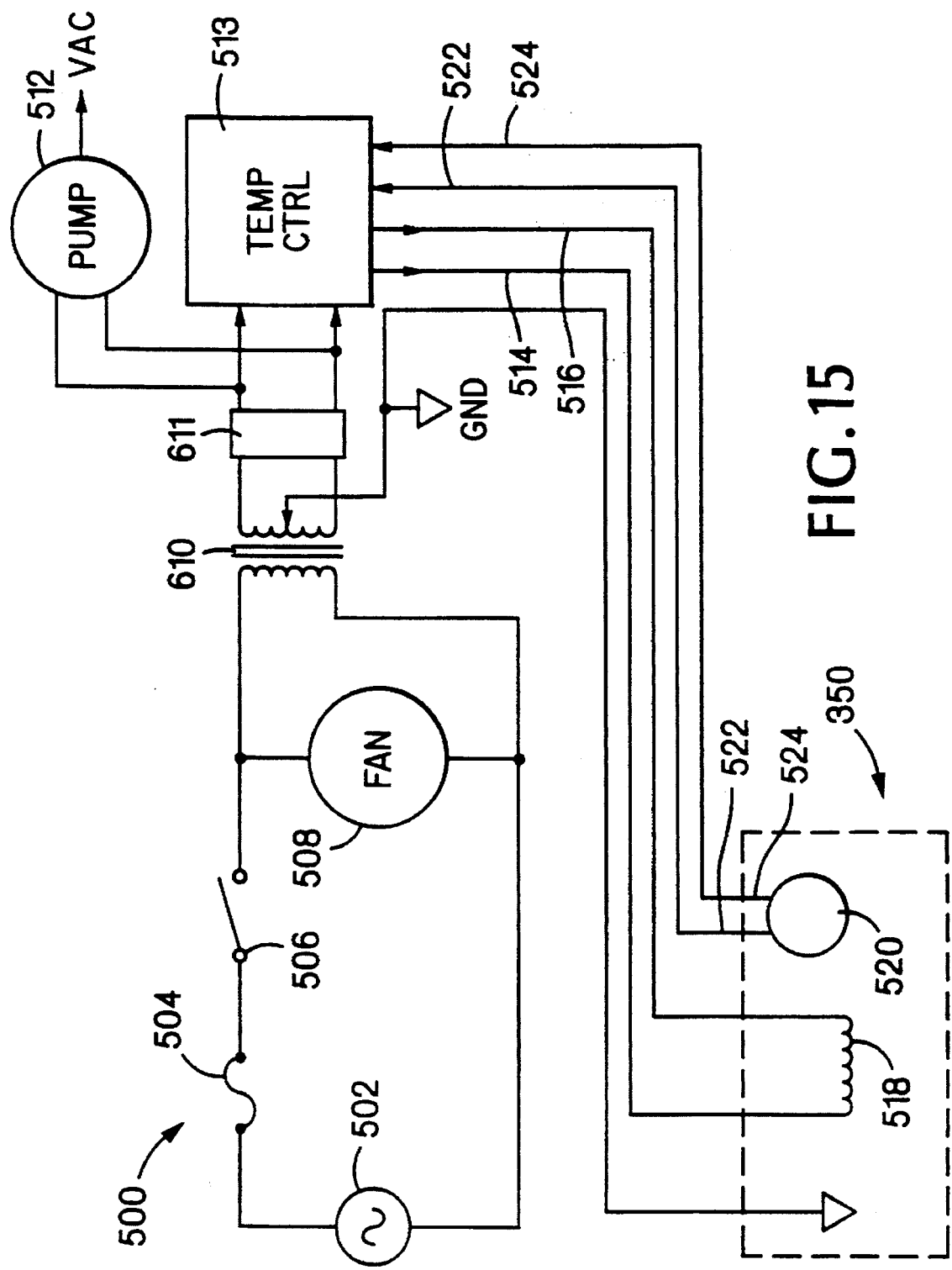
FIG. 15 is a schematic diagram of a fume extractor/contact heater for a rework station.

FIG. 15 is a schematic diagram of circuitry and electrical components in heater/fume extractor 200. Circuit 500 receives line voltage alternating current at 502. Fuse 504 protects the circuit; a main power switch 506 is connected in series with fuse 504 and is mounted in the top wall of the tri-junction box 300.

A fume extraction fan 508 is connected across the line voltage; fan 508 is mounted adjacent to front wall 202. A step-down transformer 510 and a conventional rectifier/filter circuit 611 supply 24 VDC to a vacuum pump 512 that produces vacuum pressure which is fed to contact heater 350.

The 24 VDC low voltage is also coupled to a conventional feedback-loop temperature control circuit 513. This circuit 513 provides output voltage which is coupled to a heating element 518 by wires 514, 516. The circuit also receives a feedback voltage from a thermistor 520 via wires 522, 524. Control circuit 513 uses the thermistor voltage in a conventional manner to regulate the heating element temperature. Thus, circuit 513 is responsive to a change in temperature of heating flange 402 (or heating plate 440) when it touches the component. The circuit can be formed around a Motorola CS3059 integrated circuit.

When current is applied to the heating element the body tube 352 reaches a high temperature and transfers heat to heating flange 402. As shown in FIG. 11, heating flange 402 is lowered over the pins 420 of a component 422 attached to a circuit board 424. (In FIG. 11, the exemplary component 422 shown is an SMT device.) The edges 410 of flange 402 are constructed in dimensions to match the periphery of the component. Thus, the edges can transfer heat to the pins, causing solder around the pins to melt. Vacuum pressure then pulls the component into heating flange 402, enabling the component to be removed from the board.

When heat is transferred, the temperature of heating flange 402 may drop slightly because the component 422 and circuit board 424 act as a heat sink. If this occurs, control circuit 513 senses the temperature drop and increases voltage to the heating element 518 to compensate.

Alternatively, as shown in FIG. 13A and 13B, contact heater 350 can accept a heating plate 440 rather than heating flange 402. (Other heat transfer devices can be connected to contact heater 350 also.) Heating plate has a vacuum nozzle or cup 442 in its center which rests against lip 374 when heating plate 440 is attached to contact heater 350. Vacuum is applied to a component through a hole 444; when heating plate 440 is attached to contact heater 350, the hole 444 receives vacuum through contact heater 350.

We have discovered that SMT components, including BGA devices, single inline memory modules (SIMMs), and others, can be de-soldered and removed from a circuit board by pre-heating the circuit board, and by directly conductively heating the component by contact with a device such as heating plate 440. This discovery contradicts prior teachings which caution against direct application of high heat to semiconductor devices.

The apparatus described here, and other equivalent embodiments, are useful to perform a method for de-soldering a component on a circuit board, comprising the steps of a.) applying a flow of warmed air to the circuit board on the side opposite the component; b.) heating the component on the circuit board by contact; c.) concurrently with step (b.), applying lifting force to a top surface of the component; and d.) removing the component from the board using the lifting force.

Figure 19:
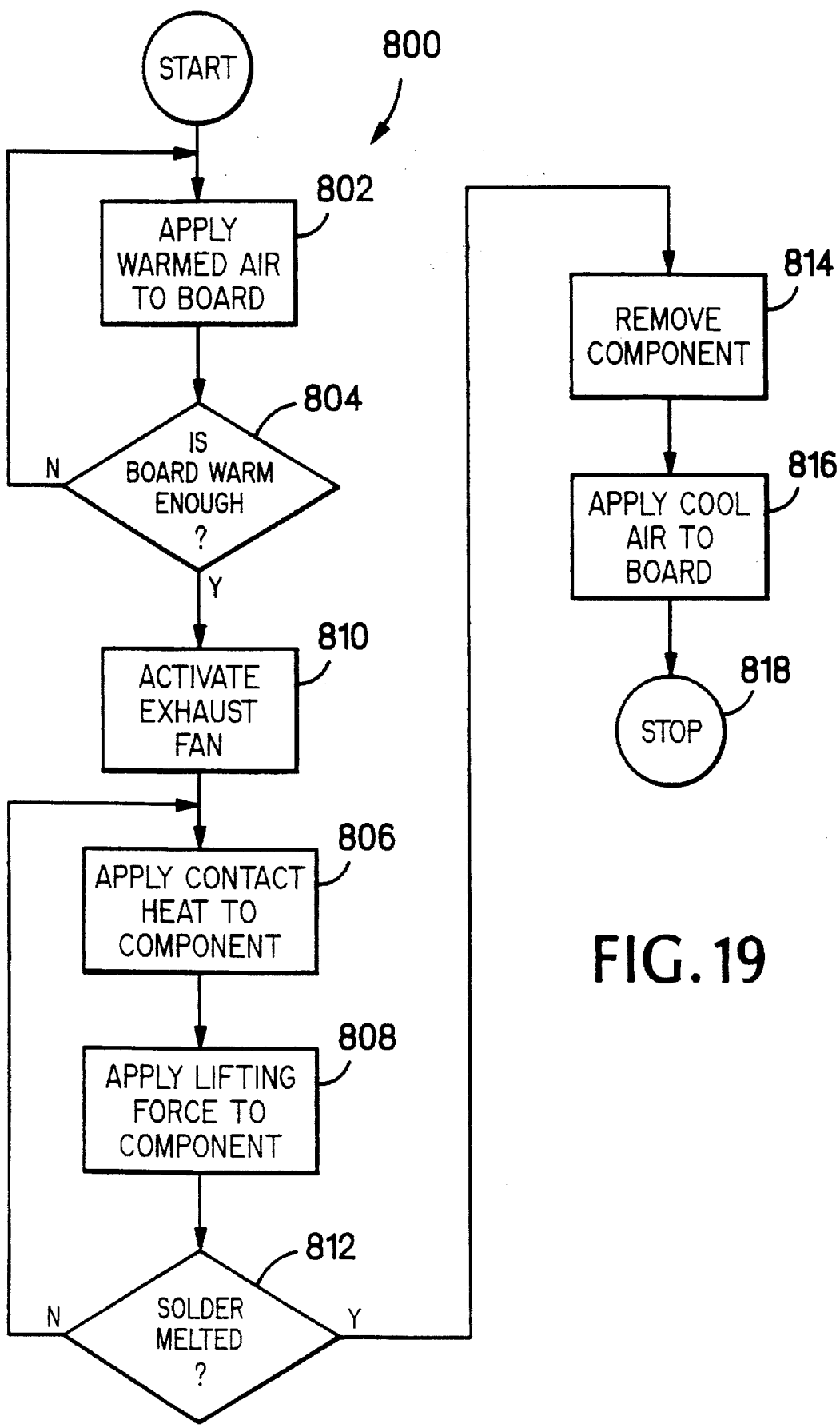
FIG. 19 is a flow diagram of a de-soldering method.

As shown in FIG. 19, in the method 800 the first step 802 is to apply warmed air to a surface of the circuit board opposite the component. For example, a circuit board held in fixture 104 can be heated with a flow of warmed air through the vent 118; the warmed air is directed to the side of the board opposite the component. The warmed air has a maximum temperature of approximately 150 degrees centigrade, and acts as a convective heat source. As shown at step 804, the warmed air is applied until the board reaches a predetermined pre-heated temperature (about 150 degrees centigrade).

Pre-heating the circuit board reduces the possibility of thermal shock to the circuit board and promotes more rapid solder reflow. Flat plates or tables have been used to heat circuit boards, but they do not evenly contact or heat the underside of the board. Many boards are populated with components on both sides, including large components such as heat sinks, transformers, etc. A warming plate rarely provides a direct heat conduction path between the plate and the board because components block direct contact. Use of a warm air flow pre-heats the board evenly; the air completely reaches a region under the component, and flows around any components on the underside of the board.

When fixture 104 is used, the circuit board can be positioned precisely over the vent 118, enabling a user to limit the air heat application to a region of the board immediately adjacent to the component to be removed. This is an optional substep of step 804.

Optionally, an exhaust fan is activated (at step 810) to remove solder fumes from a region around the circuit board and component.

Then, as shown in step 806, heat is applied to the component by direct contact of a hot element to the component or its leads. For example, a heating flange or heating plate can be placed in direct contact with the component or the leads of the component. When a plate is used to heat a BGA component, heat is conducted through the component to the solder balls at the base of the component.

Optionally, vacuum suction is applied to the component (step 808); for example, the vacuum pump in the 5 extractor/heater can be turned on to supply vacuum pressure through a bore in the contact heater. The vacuum cup in the heating plate contacts and grips the top of the component as the vacuum is applied. The vacuum cup thus compensates for any non-planarity or misalignment between the component and the heating plate, as do the planarity adjustment screws of the fixture 104.

Once the solder which holds the component to the circuit board has melted, step 812, the component is removed (step 814) using the vacuum suction or a mechanical tool. The heating plate can be upwardly spring biased so that spring tension pulls the component off the circuit board at the instant the solder melts. Such upward bias prevents bending or deforming the leads when the component separates from the circuit board. Also, when BGA components are removed from boards using prior methods, the solder balls of the BGA components tend to collapse or lose their ball-shaped form. Upward bias on the heating plate eliminates such ball collapse.

When the circuit board is pre-heated according to this method, and when a temperature control circuit such as circuit 513 is used, BGA components can be removed using a heating plate temperature of less than 260 degrees centigrade. This is a significant advantage because it enables de-soldering to occur without raising the component above the temperature at which the component was originally soldered into the board.

Optionally, cool air is quickly applied to the circuit board at step 816 to return it to room temperature.

At this point, the method is complete (step 818), although other components can be re-worked as well by returning to step 802.

The above-described device is also useful for attaching components to a circuit board. By pre-heating the circuit board, and then using the contact heater to directly conduct heat through the component, components can be soldered to circuit boards rapidly and without re-flowing the solder of adjacent components.

Figure 21:
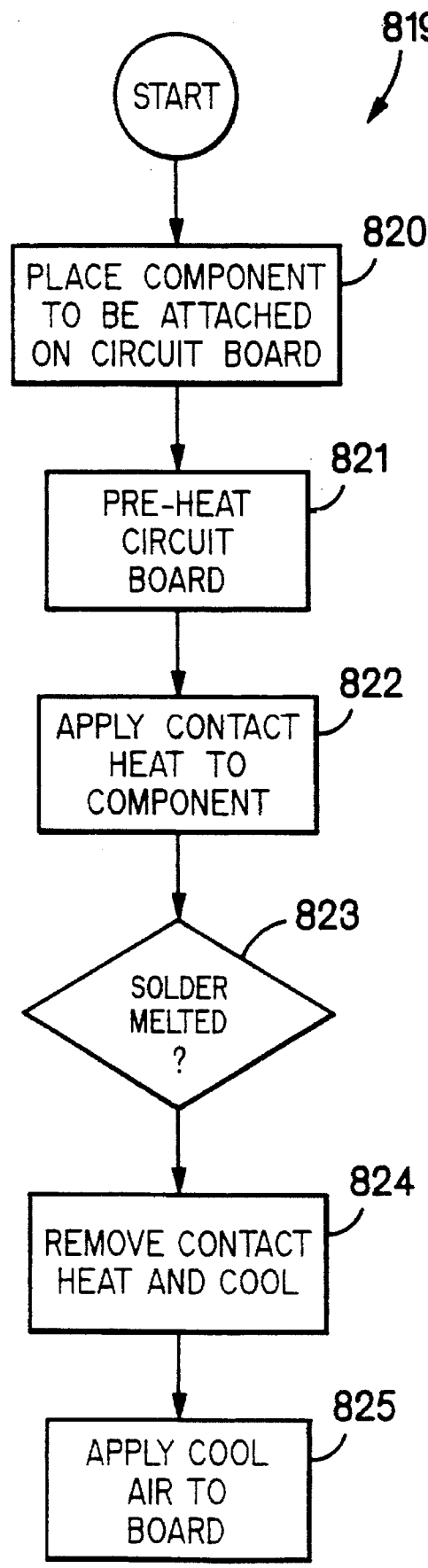
FIG. 21 is a flow diagram of a method for attaching a component to a circuit board.

Referring again to FIG. 11 and also to the flow diagram of FIG. 21, the first step 820 of a method 819 for attaching components is to place the component 422 (FIG. 11) to be attached on the circuit board 424, so that its pins 424 are aligned with corresponding foil pads (not shown) on the circuit board. When the method is used with a BGA component, the component is placed so its grid array of solder balls is aligned with a corresponding array of pads on the circuit board. The component 422 is held manually against vacuum cup 442 of heating plate 440. The vacuum source in heater/extractor 200 is activated, which holds component 422 tightly against heating plate 440. Handles 320 are moved to lower contact heater 350 down so that component 422 touches circuit board 424 in a desired location for attachment. Alternatively, component placement can be done by manually placing a component in position or by using [off-the-shelf] conventional automatic placement apparatus to feed a component into position.

The circuit board is pre-heated at step 821 by applying warmed air, preferably to a surface of the circuit board opposite the component. For example, a circuit board held in fixture 104 can be heated with a flow of warmed air through the vent 118, which is on the side of the board opposite the component. The warmed air has a maximum temperature of approximately 150 degrees centigrade. At step 804, the warmed air is applied until the board reaches a pre-determined pre-heated temperature (about 150 degrees centigrade). Pre-heating the circuit board reduces the possibility of thermal shock to the circuit board and promotes more rapid solder reflow, and reduces the amount of heat and heating time required to melt the solder. Use of a warm air flow pre-heats the board evenly; the air completely reaches a region under the component, and flows around any components on the underside of the board. When fixture 104 is used, the circuit board can be positioned precisely over the vent 118, enabling a user to limit the air heat application to a region of the board immediately adjacent to the component to be removed. This is an optional substep of step 820.

Then, at step 822, pins 420 are heated by touching a contact heater to the component 422 or its pins 420 or both, thereby heating the pins 420. For example, a heating flange or heating plate can be placed in direct contact with the component or the pins of the component. The plate or flange may contact the top or sides of the component. When a plate is used to heat a BGA component, heat is conducted through the component to the solder balls at the base of the component. The temperature of the heating plate in operation is in the range of approximately 200° centigrade to 260° centigrade.

The method as a whole, or any of its Steps 820 and 822 can also be practiced manually. For example, the contact heater 350 of FIG. 14 can be inserted into a wand such as handle 700 of FIG. 17, with a heating plate 440 (FIG. 13A) or a heating flange (FIG. 12) be attached to the contact heater in the manner described above. This embodiment is a manually movable contact heating wand. Using the wand, a user manually touches the heating plate 440 of the wand to a component, turns on the vacuum to grip the component, places the component in position on circuit board 424, and activates the heating element in the contact heater. This heats the heating plate, which conducts heat directly through the component to its pins or leads or solder balls.

Also, heat can be applied to a component (using either a wand of the type discussed above, or a contact heater held in a heater/extractor of the type shown in FIG. 4 and 11 or by a radiant heater) by bringing the heater into close proximity of the component but without actually touching the component. The contact heater is held (either manually by holding the wand, or by adjusting handles 320 up and down) to keep contact heater 350 slightly spaced apart from component 422. In this arrangement, as shown in FIG. 11, a thin air gap 423 remains between the top of the component 422 and the heating flange 402 or plate 440. No vacuum gripping is used. When heat is applied to the contact heater, the air gap is quickly heated and heat is rapidly transferred into the component. This arrangement also provides extra security against solder ball collapse and ensures that pins of a pin grid array (PGA) or SMT device are not compressed by contact.

Returning to the contact embodiment, once the solder at the base of the component 422 melts (step 823), vacuum is deactivated, the contact heater is removed, and the component is allowed to cool (step 824), and the solder solidifies, attaching the component 422 to the circuit board 424. Optionally, cool air is applied to the circuit board at step 825 to cause the solder to solidify more quickly.

Other embodiments are within the scope of the following claims. For example, a non-rectangular circuit board fixture can be used. The effect of warm air can be monitored by sensing of the temperature of the circuit board. Other methods of placing the component on the circuit board are contemplated, such as automatic placement.

Other geometries for applying heat by contact to a component can also be used to conform to component package geometries. Thus, use of a square or rectangular heating plate or a heating flange is not required; the contact heater can have a heating end with a geometry conforming to that of the component to be attached or removed.

What is claimed is:

1. A soldering work station for making or breaking a soldered connection, comprising:

a cabinet;

a heating element coupled to the cabinet for providing heat to the soldered connection;

a fume extractor filter set on a side of the cabinet adjacent the heating element for extracting from the air solder or flux fumes generated by the heating of solder;

a fume extractor fan housed in the cabinet and configured to draw air through the fume extractor filter; and an exhaust hole in the cabinet to exhaust, from the extractor fan, air filtered through the fume extractor filter.

2. A method of making or breaking a soldered connection, comprising the steps of:

moving a heating element into close proximity with a component, said heating element coupled to a cabinet;

heating the soldered connection using heat from the contact heater conducted through the component;

extracting from the air solder or flux fumes generated by the heating of solder with a fume extractor filter coupled to a side of the cabinet;

drawing air through the fume extractor filter with a fume extractor fan housed in the cabinet; and directing the air filtered by the fume extractor filter to an exhaust hole in the cabinet.

3. A device for attaching a component placed on a circuit board to the circuit board by solder, comprising:

a fixture to hold the circuit board;

a contact heater configured to heat the component on the circuit board, thereby heating the solder by conduction through the component;

a housing having at least one top wall sloping downwardly away from the circuit board;

a vent which comprises a perforated cone with a base of the cone attached to the housing; and an air heater disposed to provide a flow of warmed air to a circuit board held in the fixture, the air heater comprising a second heating element in the housing and an air blower in the housing for directing airflow across the second heating element and through the vent.

4. A method for de-soldering a component on a circuit board, comprising the steps of:

a.) applying a flow of warmed air to the circuit board on the side opposite the component;

b.) heating the component on the circuit board by contact;

c.) melting soldered joints that connect the component to the circuit board with heat conducted through the component;

d.) concurrently with step (c.), applying upward force to a top surface of the component; and e.) removing the component from the board using the upward force.

5. The method of claim 4, wherein step (a.) includes the further substep of (a1.) waiting until the temperature of the board is approximately equal to the temperature of the warmed air.

6. The method of claim 4, wherein the warmed air has a mean temperature of no greater than 150 degrees Centigrade.

7. The method of claim 4, wherein step (a.) further includes the substep of limiting the air heat application to a region of the board immediately adjacent to a set of pins of the component.

8. The method of claim 4, further including the step of (e.) applying cool air to the bottom side of the board.

9. The method of claim 4, wherein step (c.) further includes the substep of concurrently removing solder fumes from a region around the component and the board.

10. A device for removing a component soldered to a circuit board held in a holder, comprising:

an air heater that provides a flow of warmed air to the circuit board on the side opposite the component; and a contact heater that heats the component on the circuit board by contact, said contact heater comprising a housing, a slidably removable heating element in the housing, a vacuum bore in the heating element, and a flat conductive heating plate attached to the heating element, the heating plate having a vacuum nozzle coupled to the vacuum bore.

11. A device for removing a component soldered to a circuit board held in a holder, comprising:

an air heater that provides a flow of warmed air to the circuit board on the side opposite the component, the air heater including a housing, a heating element in the housing, and an air blower in the housing for directing airflow across the heating element to a vent in the housing, wherein the vent comprises a perforated cone with a base of the cone attached to the housing; and a contact heater that heats the component on the circuit board by contact.

12. A device for removing a component soldered to a circuit board held in a holder, comprising:

an air heater mounted in a closed housing to provide a flow of warmed air to the circuit board on the side opposite the component;

a contact heater that heats the component on the circuit board by contact; and a hot air pencil coupled to the air heater and to the housing.

13. A device for removing a component soldered to a circuit board held in a holder, comprising:

an air heater mounted in a closed housing to provide a flow of warmed air to the circuit board on the side opposite the component;

a contact heater that heats the component on the circuit board by contact; and a rework tool coupled to the housing, the rework tool comprising a hollow handle, electric power contacts in the handle, a soldering iron assembly having a barrel attached to a heating element that can be inserted into the handle in connection with the contacts, and a hot air pencil assembly having a nozzle attached to a second heating element that can be inserted into the handle in connection with the contacts, wherein the soldering iron assembly and the hot air pencil assembly are interchangeable.

* * * * *